(12) United States Patent
Bosboom et al.

(10) Patent No.: US 10,518,422 B2
(45) Date of Patent: *Dec. 31, 2019

(54) APPARATUS, SYSTEM AND METHOD FOR PROVIDING A CONFORMABLE VACUUM CUP FOR AN END EFFECTOR

(71) Applicant: Jabil Inc., St. Petersburg, FL (US)

(72) Inventors: Jeroen Bosboom, St. Petersburg, FL (US); Richard Munro, St. Petersburg, FL (US); Tatiana Pankova Major, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/964,365

(22) Filed: Apr. 27, 2018

(65) Prior Publication Data

US 2018/0311832 A1 Nov. 1, 2018

Related U.S. Application Data

(63) Continuation of application No. 15/380,783, filed on Dec. 15, 2016, now Pat. No. 9,975,255.

(51) Int. Cl.
*B25J 15/00* (2006.01)
*B25J 15/06* (2006.01)
*H01L 21/683* (2006.01)
*H01L 21/687* (2006.01)

(52) U.S. Cl.
CPC ....... *B25J 15/0683* (2013.01); *B25J 15/0014* (2013.01); *B25J 15/0616* (2013.01); *B25J 15/0691* (2013.01); *H01L 21/6838* (2013.01); *H01L 21/68707* (2013.01)

(58) Field of Classification Search
CPC .......... B25J 15/0683; H01L 21/6838
USPC ...... 294/183, 213; 414/941; 269/21
See application file for complete search history.

(56) References Cited

U.S. PATENT DOCUMENTS

| | | | | |
|---|---|---|---|---|
| 8,864,202 | B1 * | 10/2014 | Schrameyer | H01L 21/68707 294/213 |
| 9,524,897 | B2 * | 12/2016 | Jin | B25J 15/0616 |
| 9,757,865 | B1 * | 9/2017 | Chen | B25J 19/0091 |
| 9,760,023 | B2 * | 9/2017 | Toyomaki | G03F 7/70733 |
| 9,919,430 | B1 * | 3/2018 | Bosboom | B25J 11/0095 |
| 9,975,255 | B1 * | 5/2018 | Bosboom | H01L 21/6838 |
| 2012/0315113 | A1 * | 12/2012 | Hiroki | B65G 49/061 414/217 |

(Continued)

*Primary Examiner* — Paul T Chin
(74) *Attorney, Agent, or Firm* — Thomas J. McWilliams; Barnes & Thornburg LLP

(57) ABSTRACT

An apparatus, system and method for providing a vacuum grip for an end effector. The apparatus, system and method may include at least a vacuum draw eyelet connectively associated with a vacuum at a base portion thereof, and having a larger cross-sectional circumference at a topmost portion thereof than at the base portion; an extending cup foam portion including a receiving portion suitable for receiving therewithin the larger cross-sectional circumference of the topmost portion; and a wire clip having two legs inserted along a cross-sectional plane of the extending cup foam portion, the two legs being suitable to compress the receiving portion into frictional contact at two tangent points on a second cross-sectional circumference of the vacuum draw eyelet below the larger cross-sectional circumference.

20 Claims, 10 Drawing Sheets

(56) References Cited

U.S. PATENT DOCUMENTS

2013/0205557 A1\* 8/2013 MacArthur ............. B25B 31/00
   29/278

\* cited by examiner

APPARATUS, SYSTEM AND METHOD FOR PROVIDING A CONFORMABLE VACUUM CUP FOR AN END EFFECTOR

CROSS REFERENCE TO RELATED APPLICATION

The present application is a continuation application of U.S. Non-Provisional application Ser. No. 15/380,783, filed Dec. 15, 2016, entitled APPARATUS, SYSTEM AND METHOD FOR PROVIDING A CONFORMABLE VACUUM CUP FOR AN END EFFECTOR.

FIELD OF THE DISCLOSURE

The present disclosure relates to the transfer of articles, such as semiconductor wafers, and more particularly relates to a conformable vacuum cup, such as may be used on an end effector for gripping such wafers.

DESCRIPTION OF THE BACKGROUND

The use of robotics is well established as a manufacturing expedient, particularly in applications where human handling is inefficient and/or undesirable. One such circumstance is in the semiconductor arts, in which robotics are used to handle wafers during various wafer-processing steps. Such process steps may include, by way of example, chemical mechanical planarization (CMP), etching, deposition, passivation, and various other processes in which a sealed and/or "clean" environment must be maintained, such as to limit the likelihood of contamination and to ensure that various specific processing conditions are met.

Current practice in the semiconductor arts to robotically handle these wafers often includes the use of an end effector operably attached to the robotics, such as in order to load semiconductor wafers from a loading stack into the various processing ports that may correspond to the aforementioned exemplary process steps. That is, the robotics are employed to deploy the end effector to retrieve the wafer from a particular port or stack, such as before and/or after processing in an associated process chamber. The wafer may thus be shuttled by the robotics connectively associated with the end effector to subsequent ports for additional processing. When the wafer processing stages are complete, the robotics may then return the processed semiconductor wafer to a loading port, and may, again using the end effector, then retrieve the next wafer for processing by the system. It is typical that a stack of several semiconductor wafers is processed in this manner using the end effector during each process run.

Typical end effectors hold the wafer on its bottom side, such as using backside suction provided by, for example, vacuum draw eyelets on a portion of the end effector. These vacuum eyelets are generally multiple in number and are at the distal end portion of an end effector. This distal end of the end effector may, by way of non-limiting example, have a forked shape, a spatula shape, and so on. It is these vacuum eyelets that seize each silicon wafer for robotic transfer between semi-conductor processes, wafer aligners, wafer cassettes, and so on.

In the known art, the distal portion of the end effector is typically flat with respect to the bearing arm that interfaces to the robotics and from which the distal end of the end effector extends. As such, it is typical that the vacuum eyelets that grip the silicon wafer to the end effector are of a higher height profile, such as ¼ inch in height, from the plane provided by the distal portion of the end effector. In short, this high height profile provides sufficient space between the bottom of the wafer and the distal portion of the end effector so as to avoid contact between the wafer and the end effector. Such contact is undesirable in that it may lead to wafer damage and/or contamination.

However, such high height profile vacuum eyelets typically draw very poor vacuum, and further may not provide the desired effect of precluding contact between the wafer and the end effector, at least for wafers having warped profiles. Such warping may result either from processing effects on the wafer or even be present in the pre-processed wafer. Moreover, the issue of wafer contact with the end effector may be exacerbated for large wafers in known embodiments, at least because the poor vacuum often drawn by non-conformable vacuum cups causing greater difficulty in gripping a large wafer, and this poor gripping may cause the wafer to move or drop during transport by the robot. Accordingly, there is a need for a vacuum cup for use with end effectors that provides improved vacuum and that better protects a semiconductor wafer associated with the end effector from dropping due to insufficient vacuum grip.

SUMMARY

The disclosed embodiments are and include at least an apparatus, system and method for providing a vacuum grip for an end effector. The apparatus, system and method may include at least a vacuum draw eyelet connectively associated with a vacuum at a base portion thereof, and having a larger cross-sectional circumference at a topmost portion thereof than at the base portion; an extending cup foam portion including a receiving portion suitable for receiving therewithin the larger cross-sectional circumference of the topmost portion; and a wire clip having two legs inserted along a cross-sectional plane of the extending cup foam portion, the two legs being suitable to compress the receiving portion into frictional contact at two tangent points on a second cross-sectional circumference of the vacuum draw eyelet below the larger cross-sectional circumference.

The vacuum draw eyelet in combination with the extending cup foam portion may have a total height in a range of 1 mm to 5 mm, and more particularly may have a height of about 2 mm. The embodiments may include a second wire clip having two legs inserted substantially along the cross-sectional plane, and having second two legs substantially perpendicular to the two legs of the first wire clip and being suitable to compress the receiving portion into frictional contact at third and fourth tangent points on the second cross-sectional circumference of the vacuum draw eyelet.

Certain of the embodiments may additionally include an end effector. The end effector may include at least a bearing arm; an intermediate portion connected on a first end to the bearing arm; and a distal end connected to the intermediate portion on a second end of the intermediate portion. The distal end may include at least one vacuum draw eyelet connectively associated with a vacuum at a base portion thereof, and having a larger cross-sectional circumference at a topmost portion thereof than at the base portion; an extending cup foam portion including a receiving portion suitable for receiving therewithin the larger cross-sectional circumference of the topmost portion; and a wire clip comprising two legs inserted along a cross-sectional plane of the extending cup foam portion, the two legs being suitable to compress the receiving portion into frictional contact at two tangent points on a second cross-sectional circumference of the vacuum draw eyelet below the larger cross-sectional circumference. Thus, the embodiments provide at least a vacuum cup for use with end effectors that provides improved vacuum and that better protects a semiconductor wafer associated with the end effector from dropping due to insufficient vacuum grip.

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

Figure 1:
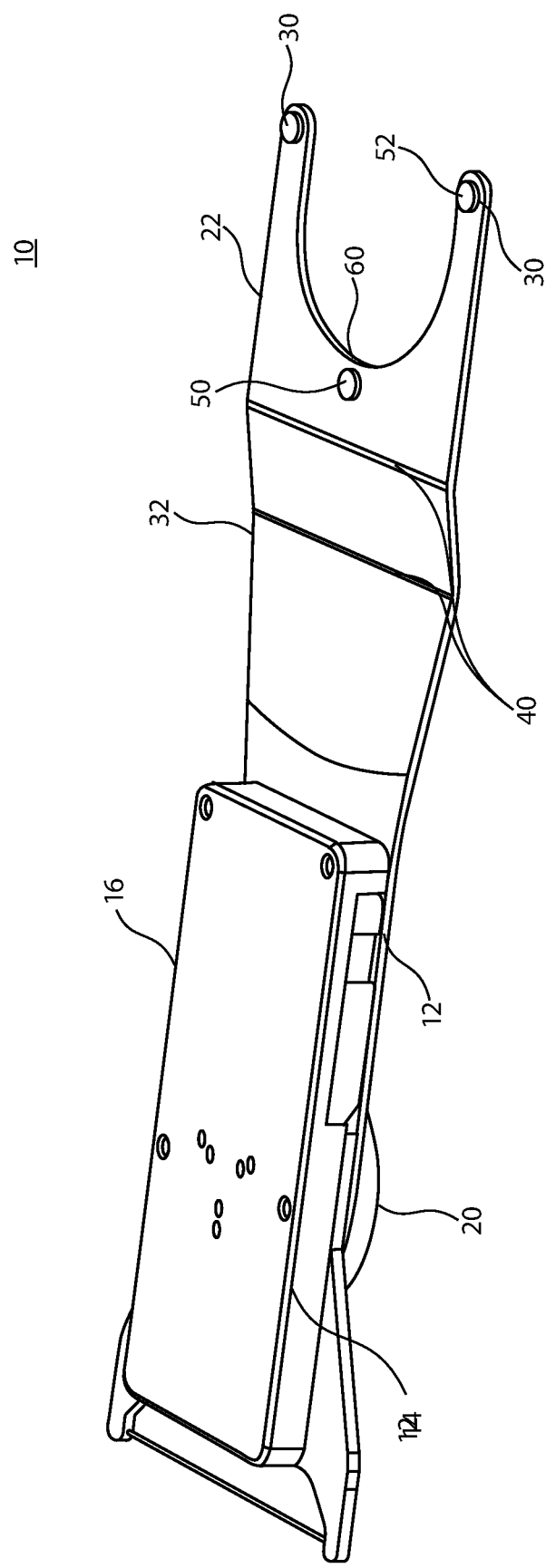
FIG. 1 is an illustration of an exemplary end effector.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

Thus, the disclosed embodiments provide a low profile vacuum cup that has a conformable, circumferentially-extending cup portion, which may be formed of foam or sponge, such as a silicon-based foam preferably with ESD properties. The extended vacuum cup may extend at least partially around the circumference of a known vacuum draw eyelet that is typically associated with an end effector.

This extending vacuum cup may have a wire clip therethrough to allow it to substantially frictionally engage around a known vacuum draw eyelet. The clip may be embedded within the foam such that the foam may be stretched over the upper circumference, or the "head," of a known vacuum draw eyelet, and once atop the head the wire clip may then "snap" around to frictionally compress a portion of the foam along an underside of the vacuum eyelet head having a circumference less than the largest circumference of the upper head. This wire clip may be a "U shape" that provides parallel wire clips along two opposing tangent points of the circumference of the vacuum draw eyelet head. Moreover, two u-shaped clips may be provided, thereby providing two parallel sets of wire clips, such as substantially perpendicularly to one another, that frictionally compress the foam against four tangent points of the vacuum draw eyelet head. This retaining clip then re-conforms the foam once the foam is stretched over the eyelet of the vacuum draw to allow the extended portion to substantially frictionally adhere over the eyelet portion.

Noting that a u-shaped clip is disclosed herein only by way of non-limiting example, the u-shape may conveniently provide parallel extending wire portions in order to enable the requisite dual-tangent point frictional contact after insertion into the foam extending cup, and may additionally provide a grasping element to readily enable insertion, i.e., the base of the u-shape. For example, the u-shape may allow for grasping of the base of the u-shape to insert the parallel wire portions, i.e., the "legs" of the u-shape, through the foam, and the exposed portions of the legs portions after insertion may be bent over towards one another in order to provide a substantially rectangular final form of the initially u-shaped wire clip.

The pressure imparted on either side of the "donut hole" within the extending cup foam portion by the wire clip, and the self-sealing nature of the foam used to provide the extending cup, cause the foam to compress about the vacuum draw eyelet head and to seal around the eyelet head and the wire, thereby preventing leakage of the vacuum draw when a silicon wafer comes into contact with the eyelet and its foam extending cup. More particularly, the extending cup foam portion thus enhances the vacuum draw of the eyelet such that a higher height profile for the vacuum draw eyelet, such as is typically used in the known art, is not necessary with certain of the disclosed embodiments. Moreover, the enhanced vacuum provided by certain of the embodiments better handles irregular surfaces and large wafers than does the known art.

In a particular embodiment, the extending cup may be in the range of 1 mm-5 mm, such as 2 mm, in height above the plane of a corresponding end effector. Consequently, the height of the vacuum draw eyelet above the plane provided by the surface of the end effector need only be of approximately the same height as the extending cup. This stands in contrast to the known art, in which, as referenced above, the typical height of the vacuum eyelet draw is 7.5 mm, i.e., ¼ inch.

As referenced throughout, the extending cup may preferably be suitable to stretch and compress, at least in order to allow the extending cup to have the donut hole thereof stretched over the vacuum eyelet head, and then to allow the wire frame within the foam to compress the foam about the eyelet in order to frictionally adhere the extending cup hole about the vacuum eyelet. Yet further, it may be preferable that the foam is immune to the buildup of electrical charge in order to best prevent damage to the silicon wafer or the devices created thereon, and consequently the foam may at least partially be formed of silicon.

FIG. 1 illustrates an exemplary end effector 10 having associated therewith a vacuum grip. In the illustration, the bearing arm 12 has associated therewith certain electronic or electro-mechanical elements 14 to allow for interoperation of the end effector with the robotics, and includes a cap 16 over said electronic and electro-mechanics. Further illustrated in FIG. 1 is a robotics flange 20 that allows for association of these electronics and electro-mechanics with a robotic arm or arms that actuate the end effector 10 such that it may move wafers between wafer processing steps.

Also shown in FIG. 1 is a fork distal end 22 of the end effector 10, which has associated therewith multiple, such as three as illustrated, vacuum pads 30 for receiving thereupon a silicon wafer. Of note, the distal end 22 may be of any known shape, such as the fork illustrated or a spatula shape.

Additionally visible in the embodiment of FIG. 1 is an intermediate portion 32 between the bearing arm 12 and the distal end 22 of the end effector, wherein the exemplary intermediate portion 32 includes one or more bends, curves, or angular portions 40 that serve to additionally prevent contact by the underside of a silicon wafer associated with the vacuum pads 30 with the distal end 22, the intermediate portion 32, or the bearing arm 12.

The vacuum pads 30 of FIG. 1 include a vacuum draw eyelet receiving portion 50, i.e., a "donut hole," which receives within its open inner circumference a vacuum draw eyelet 52. The vacuum eyelet 52 may be of the type found in the known art, such as may be formed of rubber, plastic, or the like. Extending from the eyelet receiving portion 50 to an outermost circumference 60 of vacuum pad 30 is an extending cup foam portion 62 that provides a second circumferential about the vacuum draw eyelet 52. Although reference is made throughout to the extending cup foam portion, those skilled in the art may appreciate that this feature may be formed of any of a variety of materials, such as including various types of foam.

Figure 2:
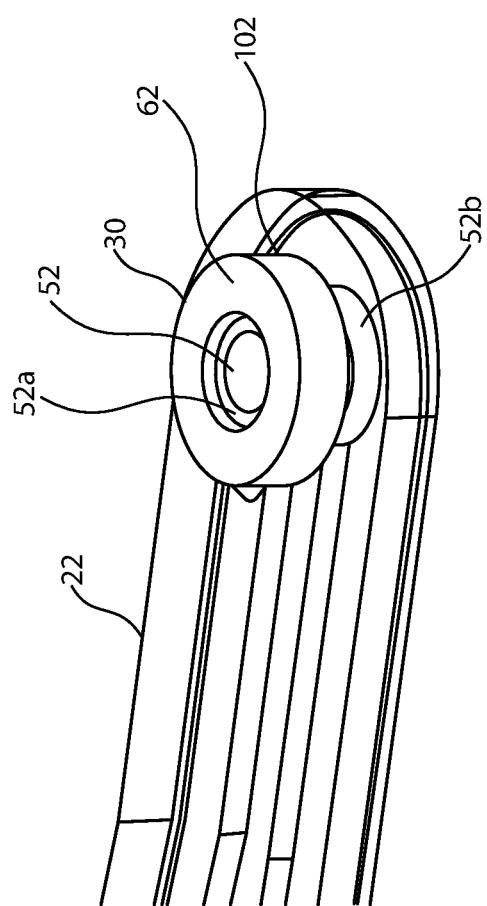
FIG. 2 illustrates an exemplary vacuum pad in association with a distal end of an end effector.

FIG. 2 illustrates with greater particularity an exemplary vacuum pad 30 in association with a distal end 22. As illustratively shown, the eyelet 52 may circumferentially vary from the base thereof 52a to the topmost portion, or "head" 52b, thereof. This circumferential variation may provide a portion of the eyelet 52, such as just under the head 52b, which a wire retaining clip 102 may frictionally engage in order to hold the extending cup foam portion 62 over the eyelet 52.

Thus, as is evident in FIG. 2, the extending cup foam portion 62 may be of a substantially greater circumference than the circumference of the topmost portion 52a of the eyelet 52. Moreover, the wire frame 102 may extend through the extending cup foam portion 62, such as substantially midway between the topmost portion of the extending cup foam portion 62 and the bottommost portion of the extending cup foam portion 62. The wire frame 102 may be composed of stainless steel, by way of non-limiting example.

Figure 3:
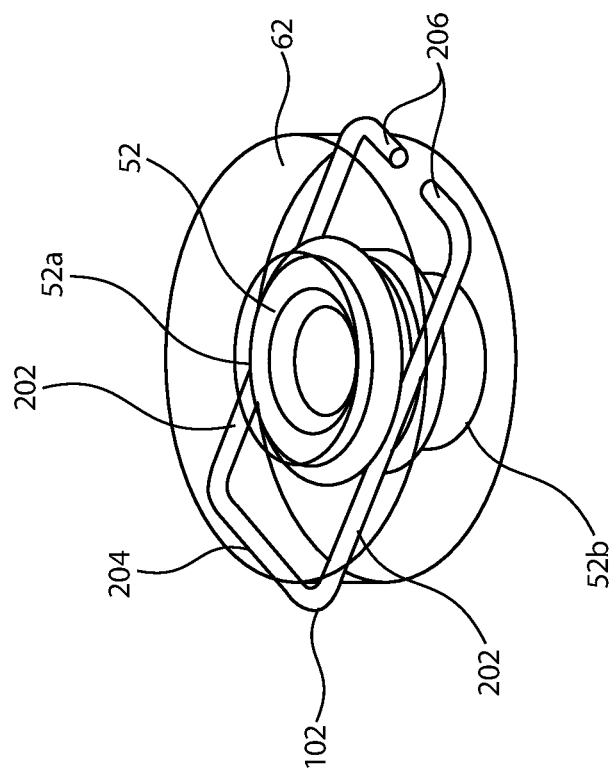
FIG. 3 illustrates an exemplary vacuum draw eyelet having an enlarged head portion.

FIG. 3 illustrates an exemplary eyelet 52 having an enlarged head portion 52a in relation to a base circumference 52b thereof. As shown in FIG. 3, a u-shaped wire frame 102 has been placed substantially through the center of the extending cup foam portion 62, with conjoining portion of the wire frame 102 between the wire legs 202 providing a connective portion 204 which may be used to insert legs 202, and wherein the exposed ends 206 of legs 202 have been bent over upon one another where those legs 202 protrude from the extending cup foam portion 62. Moreover, the legs 202 of the wire frame 102 illustratively engage just under the head 52a of eyelet 52. Accordingly, the u-shaped wire frame 102 provides a clip that retains the extending cup foam portion 62 over the vacuum draw eyelet 52.

Figure 4:
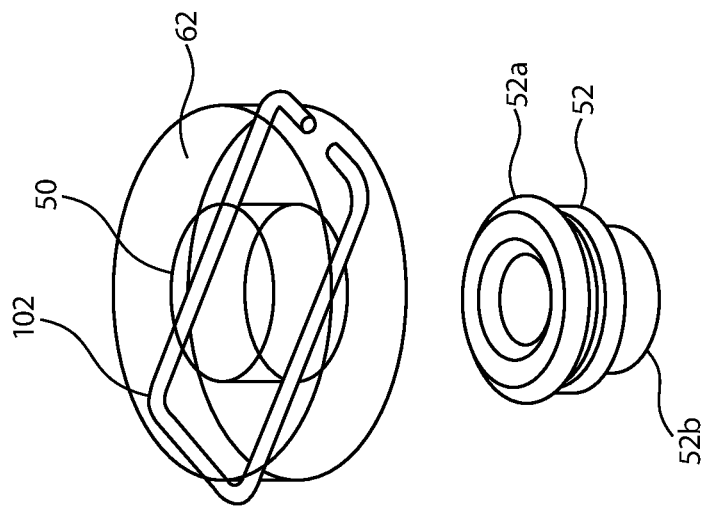
FIG. 4 illustrates an exemplary extending cup foam portion having a wire retaining clip.

FIG. 4 illustrates the extending cup foam portion 62 having a wire retaining clip 102 placed therethrough just prior to the association of the extending cup foam portion 62 with a typical vacuum draw eyelet 52 having a varying circumference from the topmost portion 52a to the bottommost portion 52b thereof, and wherein the topmost portion 52a has a large top circumference to allow for retention of the wire clip 102 thereunder. Thus, the wire clip 102 through the extending cup foam portion 62 can grip under the topmost portion 52a of the eyelet 52 after the sufficiently pliable receiving portion 50 has been stretched over the topmost portion 52a.

Figure 5:
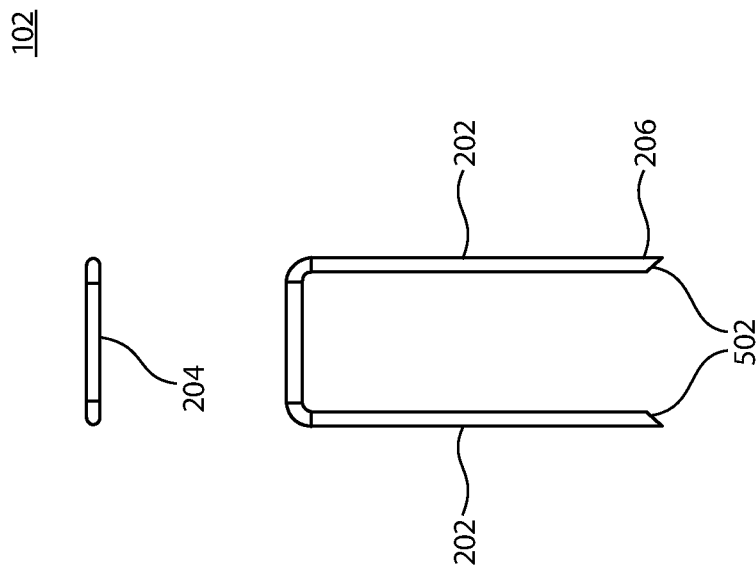
FIG. 5 illustrates an exemplary u-shaped wire frame.

FIG. 5 illustrates an exemplary u-shaped wire frame 102 that may be pierced through a cross-sectional plane of the extending cup foam portion 62, in order to allow for operation of the retaining wire clip 102 discussed throughout. As illustrated, the wire frame 102 may have a u-shape, although other wire frames shapes and types may be provided. The wire legs 202 may be angled or pointed 502 at the tips 206 thereof, by way of non-limiting example, such as to allow for the wire frame 102 to be readily pierced through the cross-section of the extending cup foam portion 62. Needless to say, the perpendicular distance between the legs 202 of the u-shaped wire frame 102 may be slightly smaller than the topmost diameter of the vacuum draw eyelet 52a, and/or approximately equal to the diameter of the eyelet 52 at the point on the eyelet 52 at which the wire frame 102 is to adhere to the eyelet 52, such that the wire clip will suitably maintain the extending cup foam portion 62 in place on the eyelet, even when low level forces, such as a vacuum draw and/or placement of a wafer, are applied.

Figure 6:
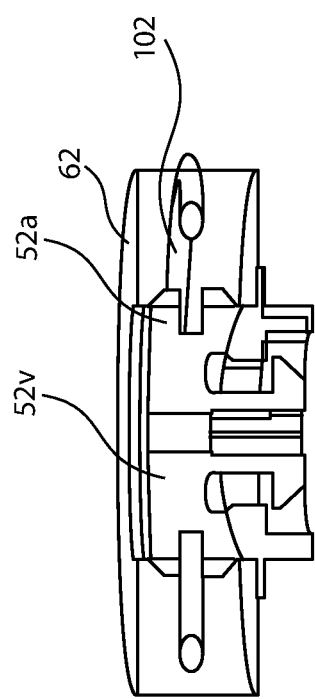
FIG. 6 illustrates a cross-section of an exemplary extending cup foam portion having a wire retaining clip.

FIG. 6 illustrates a cross-section of an extending cup foam portion 62 having a wire retaining clip 102 that is clipped just beneath the topmost circumference 52a of a vacuum draw eyelet 52. As illustrated, the wire retaining clip 102 may contract or substantially contract the circumference extending cup foam portion 62 most substantially at two points in order to provide tangential friction at those two points on the circumference of the vacuum draw eyelet 52. As such, it may be preferred that these two points are on substantially opposing points along a diameter of the vacuum draw eyelet 52.

Figure 7:
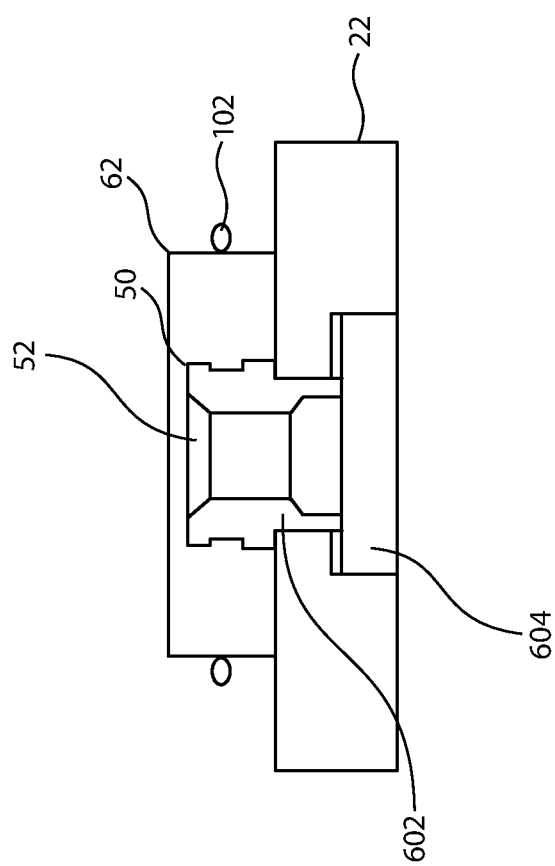
FIG. 7 illustrates a cross-section of an exemplary extending cup foam portion with a wire frame clip.

FIG. 7 illustrates a cross-section of the physical association of an extending cup foam portion 62 with a wire frame 102 therethrough with a vacuum draw eyelet 52 that is fastened via a fastener 602, such as via threads, to the distal portion 22 of an end effector, and that has one or more vacuum channels 604 leading to the base portion 52b of the vacuum draw eyelet 52. The extending cup foam portion 62 may have a height extending above the plane provided by the distal end 22 of the end effector of, by way of non-limiting example, 2 mm. Moreover, the extending cup foam portion 62 may be of a construction that is highly conformable, such as to allow the inner circumference 50 of the extending cup foam portion 62 to be conformed over the topmost circumference 52a of the vacuum draw eyelet 52, after which the wire frame 102 may compress the inner circumference 50 of the extending cup foam portion 62 such that the extending cup foam portion 62 is thereby retained about the vacuum draw eyelet 52.

Further, the conformable nature of the extending cup foam portion 62 may allow for adaptability and improved vacuum to irregular surfaces on a semi-conductor wafer, process formations on a silicon wafer such as solder bumps or the like, and larger wafers. The foregoing are all embodiments in which the rigid vacuum eyelets of the known art provide a poor vacuum seal and substantially higher profile heights, which also lead to poor vacuum and poor adaptability.

Figure 8:
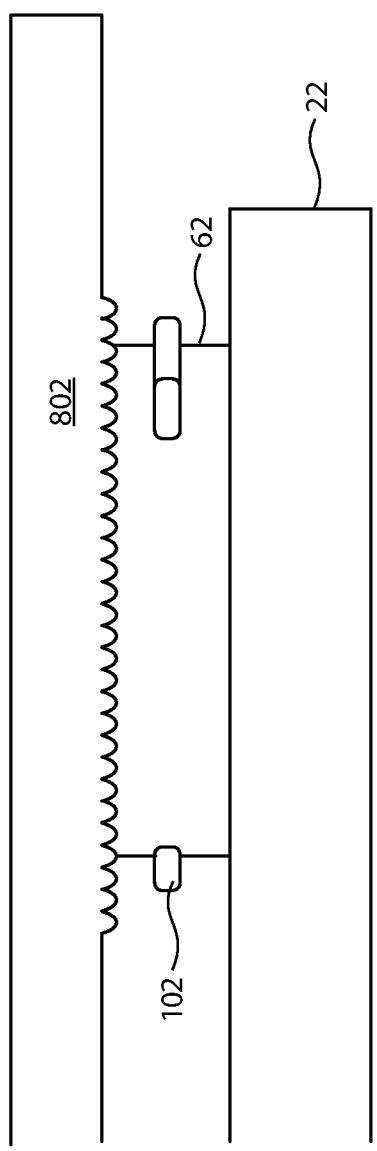
FIG. 8 is a profile illustration of an exemplary extending cup foam portion with a semi-conductor wafer thereon.

FIG. 8 provides a profile illustration of the association of the extending cup foam portion 62 physically with a semiconductor wafer 802. In the illustration, the open cell format of the extending cup foam portion 62 conforms and seals to the irregular, tilted, and bumpy surfaces provided by the silicon wafer 802.

Figure 9:
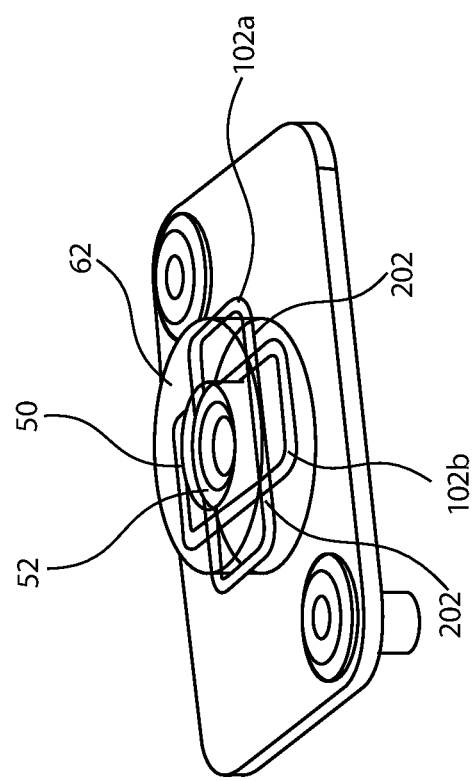
FIG. 9 illustrates two u-shaped wire frame clips mounted to a sub-plate.

FIG. 9 illustrates a certain embodiment in which two u-shaped wire frame clips 102a, 102b are provided as retaining clips. As will be understood by the skilled artisan, the addition of a second u-shaped wire clip 102b having parallel extending legs 202 provides two additional tangential frictional contact points of the second wire frame 102b with eyelet 52. Thereby, four tangential frictional contact points in total, from the four legs 202 of wire frames 102a, 102b, provide an enhanced physical association of the extending cup foam portion 62 with the vacuum draw eyelet 52.

Figure 10:
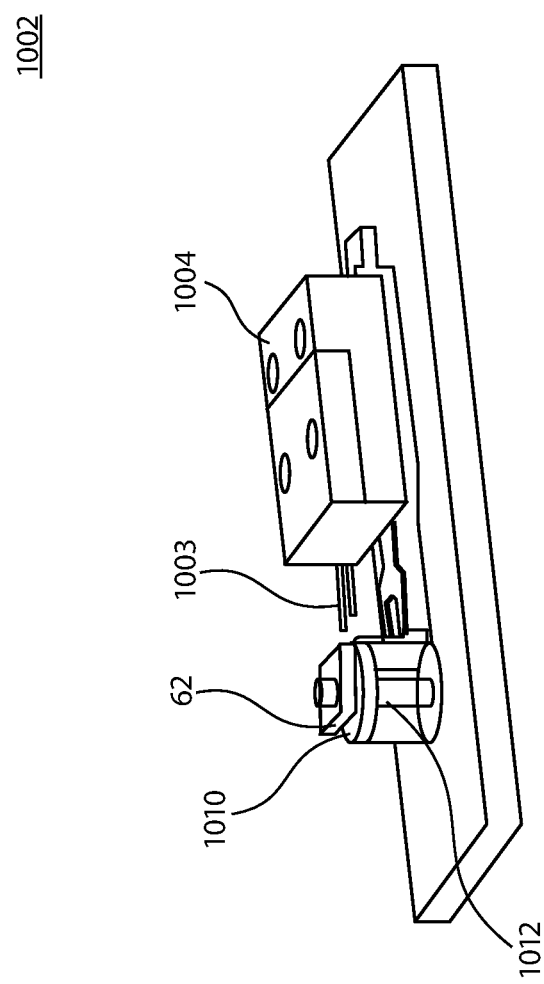
FIG. 10 illustrates an exemplary u-shaped wire frame inserter.

FIG. 10 provides an exemplary embodiment of a u-shaped wire frame inserter 1002 for use with the disclosed wire frames 102 and extending cup foam portion 62. In the illustration, the u-shaped wire frame 102 may be inserted, with the legs 202 thereof facing towards the extending cup foam portion 62, into cylinders 1003 of a slider brace 1004 that may be slideably associated with a low friction slider 1006, such as at the base of brace 1004. In short, the cylinders 1003 may be slid on brace 1004 to pierce through the extending cup 62, so that the end of wire legs 202 of wire clip frame 102 may be received into the cylinders 1003 on the side of extending cup 62 opposite the sliding brace 1004. Further, the extending cup foam portion 62 may be placed on a chuck 1010, such as may have a center holding portion 1012 extending upwardly from the chuck 1010 that is approximately matched to the size of the inner circumference 50 of the extending cup foam portion 62, in order to eventually receive insertion of cylinders 1003 and wire legs 202.

Figure 11:
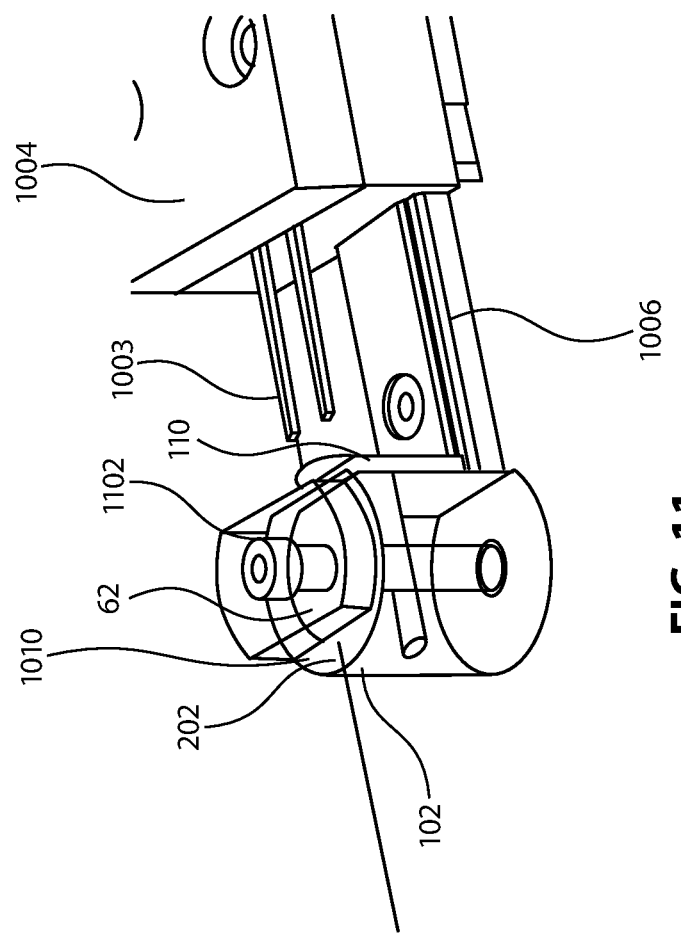
FIG. 11 is an illustration of an exemplary wire frame inserter.

FIG. 11 is a closer illustration of an exemplary wire frame inserter 1002. As illustrated in FIG. 11, a locking plate 1102 may be inserted atop the extending cup foam portion 62 in order to lock the extending cup foam portion 62 in position in relation to the chuck 1010. Moreover, at a portion of the chuck 1010 proximal to the sliding brace 1004 may be provided a guide plate 1110, through which cylinders 1003 may be guided to the proper cross-sectional plane of extending cup foam portion 62 at which wire legs 202 are to be received. Thereby, when the sliding brace 1004 is pushed forward, the cylinders 1003 may go through the guide plate 1110 to allow for eventual insertion of wire legs 202 into cylinders 1003 at the desired height and position into the extending cup foam portion 62. Once the legs 202 are fully inserted, the sliding brace 1004 may be slid away to remove cylinders 1003, the wire legs 202 now protruding from the proximal arc (in relation to brace 1004) of the extending cup foam portion 62 may be bent over in order to complete the clip, the lock 1102 atop the chuck 1010 may be removed, and the extending cup foam portion 62 may be slid upwardly along the center extension of the chuck 1010 for removal. Of course, those skilled in the art will appreciate that other insertion mechanisms for wire clip frame 102 may be provided, and hence that the above-referenced inserter 1002 is provided only by way of example.

As such, the extending cup foam portion provides enhanced sealing for improved vacuum adhesion to rough surface geometries for semiconductor processing, such as solder bump surfaces, trenched wafers, grooved solar cells, large wafers having uneven warping, and the like. Moreover, the open cell structure of, for example, conductive silicon foam, as may be used in the extending cup foam portion, readily compresses and seals as the vacuum is applied, thereby enhancing the vacuum drawn by the vacuum draw eyelet. Moreover, to the extent the topmost height profile provided by the extending cup foam portion is slightly higher than the topmost height profile of the vacuum draw eyelet, the conformable top vacuum surface readily conforms to tilted geometries and random surfaces, to thereby provide an improved seal to such surfaces as the extending cup foam portion is compressed by the vacuum draw.

And as referenced, the insertion of the wire clip into and through the extending cup foam portion does not diminish the vacuum draw, in part because the extended foam portion is compliant and conforms about the metal clip in order to seal any vacuum leaks. This property of the extending cup foam portions similarly enhances the vacuum drawn by the vacuum draw eyelet over prior embodiments, as discussed above.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A vacuum grip for an end effector, comprising:
   at least one vacuum draw eyelet communicatively associated with a vacuum, and having a groove substantially circumferentially thereabout;
   an extending foam cup including a receiving inner circumference suitable for receiving therein at least the groove; and
   a wire clip comprising two legs inserted along a cross-sectional plane of the extending foam cup, the two legs being suitable to compress the receiving inner circumference into frictional contact with the groove.

2. The vacuum grip of claim 1, wherein the wire clip comprises stainless steel.

3. The vacuum grip of claim 1, wherein the extending foam cup is comprised of silicon.

4. The vacuum grip of claim 1, wherein the wire clip further comprises a leg-joining portion capable of receiving force to insert the wire clip.

5. The vacuum grip of claim 1, wherein the wire clip further comprises overlapped ends of the legs to close the wire clip at a distal point from the insertion.

6. The vacuum grip of claim 1, wherein the groove is substantially midway between a top plane and a bottom plane of the vacuum draw eyelet.

7. The vacuum grip of claim 1, wherein the vacuum draw eyelet comprises one of rubber and plastic.

8. The vacuum grip of claim 1, wherein the vacuum draw eyelet in combination with the extending foam cup has a total height in a range of 1 mm to 5 mm.

9. The vacuum grip of claim 8, wherein the total height is about 2 mm.

10. The vacuum grip of claim 1, further comprising a second wire clip having a second two legs inserted to the groove substantially perpendicular to the two legs.

11. The vacuum grip of claim 1, further comprising a distal end of the end effector to which the vacuum draw eyelet is mounted.

12. The vacuum grip of claim 11, wherein the distal end comprises a fork distal end.

13. The vacuum grip of claim 12, wherein the at least one vacuum draw eyelet comprises at least three vacuum draw eyelets.

14. The vacuum grip of claim 11, wherein the extending foam cup comprises an open cell format.

15. An end effector, comprising:
   a bearing arm;
   an intermediate portion connected on a first end to the bearing arm;
   a distal end connected to the intermediate portion on a second end of the intermediate portion, and comprising:
      at least one vacuum draw eyelet communicatively associated with a vacuum, and having a groove substantially circumferentially thereabout;
      an extending foam cup including a receiving inner circumference suitable for receiving therein at least the groove; and
      a wire clip comprising two legs inserted along a cross-sectional plane of the extending foam cup, the two legs being suitable to compress the receiving inner circumference into frictional contact with the groove.

16. The end effector of claim 15, wherein the intermediate portion includes at least one angular portion.

17. The end effector of claim 15, wherein the bearing arm comprises a robotic flange and electromechanical elements to engage the robotic flange.

18. The end effector of claim 15, wherein the groove is substantially midway between a top plane and a bottom plane of the vacuum draw eyelet.

19. The end effector of claim 15, wherein the vacuum draw eyelet comprises one of rubber and plastic.

20. The end effector of claim 15, wherein the vacuum draw eyelet in combination with the extending foam cup has a total height of about 2 mm.

* * * * *